(12) United States Patent
Kumar et al.

(10) Patent No.: US 12,732,146 B1
(45) Date of Patent: Sep. 8, 2026

(54) ANALOG AMPLITUDE CONTROL CIRCUIT TO OPTIMIZE DRIVE LEVEL OF CRYSTAL OSCILLATOR

(71) Applicant: Synopsys, Inc., Sunnyvale, CA (US)

(72) Inventors: Jayanthi Sri Ram Kumar, Rajahmundry (IN); Rahul Gupta, Faridabad (IN)

(73) Assignee: Synopsys, Inc., Sunnyvale, CA (US)

( * ) Notice: Subject to any disclaimer, the term of this patent is extended or adjusted under 35 U.S.C. 154(b) by 447 days.

(21) Appl. No.: 18/521,316

(22) Filed: Nov. 28, 2023

(51) Int. Cl.
*H03F 3/45* (2006.01)
*H03B 5/32* (2006.01)

(52) U.S. Cl.
CPC .......... *H03F 3/45269* (2013.01); *H03B 5/32* (2013.01)

(58) Field of Classification Search
CPC .......................... H03F 3/45269; H03B 5/32
See application file for complete search history.

(56) References Cited

U.S. PATENT DOCUMENTS

2006/0097812 A1* 5/2006 Maeder .................. H03B 5/06 331/182
2008/0252390 A1* 10/2008 Guerreiro .............. H03B 5/32 331/158
2012/0161889 A1* 6/2012 Ozawa .................. H03B 5/364 331/116 FE
2017/0179961 A1* 6/2017 Itasaka .................. H03L 1/04

* cited by examiner

*Primary Examiner* — Jeffrey M Shin
(74) *Attorney, Agent, or Firm* — Weaver Austin Villeneuve & Sampson LLP

(57) ABSTRACT

A circuit includes, in part, a transconductance amplifier, a common source amplifier, a resistor, and NMOS transistor. The common source amplifier is coupled to an output of the transconductance amplifier and generates a signal coupled to an output terminal of a crystal oscillator circuit. The resistor is coupled between the transconductance amplifier and the ground terminal. The NMOS transistor has a drain terminal coupled to a first terminal of the first resistor, a source terminal coupled to a second terminal of the first resistor, and a gate terminal coupled to an input terminal of the common source amplifier and to an input terminal of the crystal oscillator circuit.

20 Claims, 4 Drawing Sheets

ANALOG AMPLITUDE CONTROL CIRCUIT TO OPTIMIZE DRIVE LEVEL OF CRYSTAL OSCILLATOR

TECHNICAL FIELD

The present application relates to analog circuits, and more particularly to an analog circuit adapted to control the drive level of a crystal oscillator.

BACKGROUND

In advanced semiconductor fabrication technology nodes, such as 7 nm and below, the difference between the voltage applied to input/output (I/O) transistors and the voltage applied to core transistors poses a challenge in designing a crystal oscillator driver circuit that can drive the crystal oscillator safely at both the I/O voltage and the core voltage. For example, the I/O voltage may vary from 1.8 to 3.2 volts for a 5 nm node, whereas the core voltage may vary from 0.4 to 0.9 volts. In such advanced technology nodes, the core voltage scales to relatively very low values, thereby making it difficult to design a crystal oscillator at such low core voltages. The low core voltage constraints leads to development of crystal oscillator at IO voltage, which in turn, leads to higher swing of the crystal oscillations. The higher swing across the crystal increases the drive level beyond the prescribed limit and thus can destroy the crystal, or lead to higher degradation over the crystal's lifetime.

SUMMARY

A circuit, in accordance with one embodiment of the present disclosure includes, in part, a transconductance amplifier; a common source amplifier coupled to an output of the transconductance amplifier and generating a signal coupled to an output terminal of a crystal oscillator circuit; a first resistor coupled between the transconductance amplifier and a ground terminal; and a first NMOS transistor having a drain terminal coupled to a first terminal of the first resistor, a source terminal coupled to a second terminal of the first resistor, and a gate terminal coupled to an input terminal of the common source amplifier and to an input terminal of the crystal oscillator circuit.

In one embodiment, the transconductance amplifier includes, in part, a first PMOS transistor having a source terminal coupled to a supply voltage; a second NMOS transistor having gate and drain terminals coupled to a drain terminal of the first PMOS transistor, and a source terminal coupled to the ground terminal; a second PMOS transistor having a source terminal coupled to the supply voltage, and gate and drain terminals coupled to a gate terminal of the first PMOS transistor; a third NMOS transistor having a gate terminal coupled to the gate terminal of the second NMOS transistor, and a drain terminal coupled to the drain terminal of the second PMOS transistor; and a second resistor having a first terminal coupled to a source terminal of the third NMOS transistor and a second terminal coupled to the first terminal of the first resistor.

In one embodiment, the common source amplifier includes, in part, a third PMOS transistor having a gate terminal coupled to the gate terminal of the second PMOS transistor, and a source terminal coupled to the supply voltage; a fourth NMOS transistor having a gate terminal coupled to the gate terminal of the first NMOS transistor, a drain terminal coupled to a drain terminal of the third PMOS transistor, and a source terminal coupled to the ground terminal.

4. In on embodiment, the ratio of the channel-width to channel-length of the first NMOS transistor is selected such that at a DC biasing point, a current flowing through the second resistor flows to the ground terminal substantially through the first NMOS transistor. In one embodiment, at the DC biasing point, the gate and drain terminals of the fourth NMOS transistor are substantially at the same voltage. In one embodiment, the resistance of the first resistor is at least three times the resistance of the second resistor. In one embodiment, by varying the gate voltage of the first NMSO transistor, the current through the third PMOS transistor is varied.

A method, in accordance with one embodiment of the present disclosure includes, in part, forming a transconductance amplifier; coupling an output of the transconductance amplifier to a common source amplifier, the common source amplifier generating a signal coupled to an output terminal of a crystal oscillator circuit; coupling a first resistor between the transconductance amplifier and a ground terminal; and forming a first NMOS transistor having a drain terminal coupled to a first terminal of the first resistor, a source terminal coupled to a second terminal of the first resistor, and a gate terminal coupled to an input terminal of the common source amplifier and to an input terminal of the crystal oscillator circuit.

In one embodiment of the method, the transconductance amplifier includes, in part, a first PMOS transistor having a source terminal coupled to a supply voltage; a second NMOS transistor having gate and drain terminals coupled to a drain terminal of the first PMOS transistor, and a source terminal coupled to the ground terminal; a second PMOS transistor having a source terminal coupled to the supply voltage, and gate and drain terminals coupled to a gate terminal of the first PMOS transistor; a third NMOS transistor having a gate terminal coupled to the gate terminal of the second NMOS transistor, and a drain terminal coupled to the drain terminal of the second PMOS transistor; and a second resistor having a first terminal coupled to a source terminal of the third NMOS transistor and a second terminal coupled to the first terminal of the first resistor.

In one embodiment of the method, the common source amplifier includes, in part, a third PMOS transistor having a gate terminal coupled to the gate terminal of the second PMOS transistor, and a source terminal coupled to the supply voltage; a fourth NMOS transistor having a gate terminal coupled to the gate terminal of the first NMOS transistor, a drain terminal coupled to a drain terminal of the third PMOS transistor, and a source terminal coupled to the ground terminal.

In one embodiment, the ratio of the channel-width to channel-length of the first NMOS transistor is selected such that at a DC biasing point, the current flowing through the second resistor flows to the ground terminal substantially through the first NMOS transistor. In one embodiment, at the DC biasing point, the gate and drain terminals of the fourth NMOS transistor are substantially at the same voltage. In one embodiment, the resistance of the first resistor is at least three times the resistance of the second resistor. In one embodiment, the method further includes, in part, varying the current through the third PMOS transistor by varying the gate voltage of the first NMSO transistor.

A non-transitory computer readable medium, in accordance with one embodiment of the present disclosure, includes stored instructions which when executed by a processor, cause the processor to generate a circuit design. The circuit design includes, in part, a transconductance amplifier; a common source amplifier coupled to an output of the transconductance amplifier and generating a signal coupled to an output terminal of a crystal oscillator circuit; a first resistor coupled between the transconductance amplifier and a ground terminal; and a first NMOS transistor having a drain terminal coupled to a first terminal of the first resistor, a source terminal coupled to a second terminal of the first resistor, and a gate terminal coupled to an input terminal of the common source amplifier and to an input terminal of the crystal oscillator circuit.

In one embodiment, the transconductance amplifier includes, in part, a first PMOS transistor having a source terminal coupled to a supply voltage; a second NMOS transistor having gate and drain terminals coupled to a drain terminal of the first PMOS transistor, and a source terminal coupled to the ground terminal; a second PMOS transistor having a source terminal coupled to the supply voltage, and gate and drain terminals coupled to a gate terminal of the first PMOS transistor; a third NMOS transistor having a gate terminal coupled to the gate terminal of the second NMOS transistor, and a drain terminal coupled to the drain terminal of the second PMOS transistor; and a second resistor having a first terminal coupled to a source terminal of the third NMOS transistor and a second terminal coupled to the first terminal of the first resistor.

In one embodiment, the common source amplifier includes, in part, a third PMOS transistor having a gate terminal coupled to the gate terminal of the second PMOS transistor, and a source terminal coupled to the supply voltage; a fourth NMOS transistor having a gate terminal coupled to the gate terminal of the first NMOS transistor, a drain terminal coupled to a drain terminal of the third PMOS transistor, and a source terminal coupled to the ground terminal.

In one embodiment, the ratio of a channel-width to channel-length of the first NMOS transistor is selected such that at the DC biasing point, the current flowing through the second resistor flows to the ground terminal substantially through the first NMOS transistor. In one embodiment, at the DC biasing point, the gate and drain terminals of the fourth NMOS transistor are substantially at the same voltage. In one embodiment, the resistance of the first resistor is at least three times the resistance of the second resistor.

DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Crystal oscillators are widely used in electronic circuits to supply an oscillating signal that operates as a clock source to the sequential elements, such as flip-flops and latches, disposed in the electronic circuits. A crystal oscillator is external to a circuit and is often mounted on a printed circuit board. A crystal oscillator has an equivalent series resistance (ESR) that is specified by the manufacturer. The ESR of the crystal oscillator is used by a designer to establish a negative resistance by an amplifier of a driver circuit driving the crystal oscillator.

A conventional technique used to limit the current driving a crystal oscillator is to connect an external resistor in series with an output of an amplifier driving the crystal oscillator. However, adding such an external resistor has a number of disadvantages among which are (i) increased cost, (ii) reduced phase difference between the input and output signals of the crystal oscillator, thereby leading to a degraded duty cycle, and (iii) degraded harmonic performance between the input and output signals of the crystal oscillator.

Embodiments of the present disclosure overcome the above shortcomings by, in part, monitoring the amplitude of the oscillation at the input of the crystal oscillator and in response, decreasing the biasing current of the amplifier driving the crystal oscillator. A crystal oscillator driver circuit in accordance with embodiments of the present disclosure, among other advantages, (i) does not change the impedance of the crystal oscillator and hence does not slow down the crystal oscillator at the startup, (ii) achieves the desired level of oscillation for a relatively large range of supply voltages by tuning the feedback settings of the driving circuit, (iii) reduces the power consumption as the steady state current in the amplifier driving the crystal oscillator is reduced, and (v) improves the harmonic performance between the input and output signals of the crystal oscillator. The improvement in the harmonic performance of the crystal oscillator results from the reduced swing of the voltage signal across the crystal oscillator which, in turn, causes the voltage signal across the oscillator to become more sinusoidal.

Figure 1:
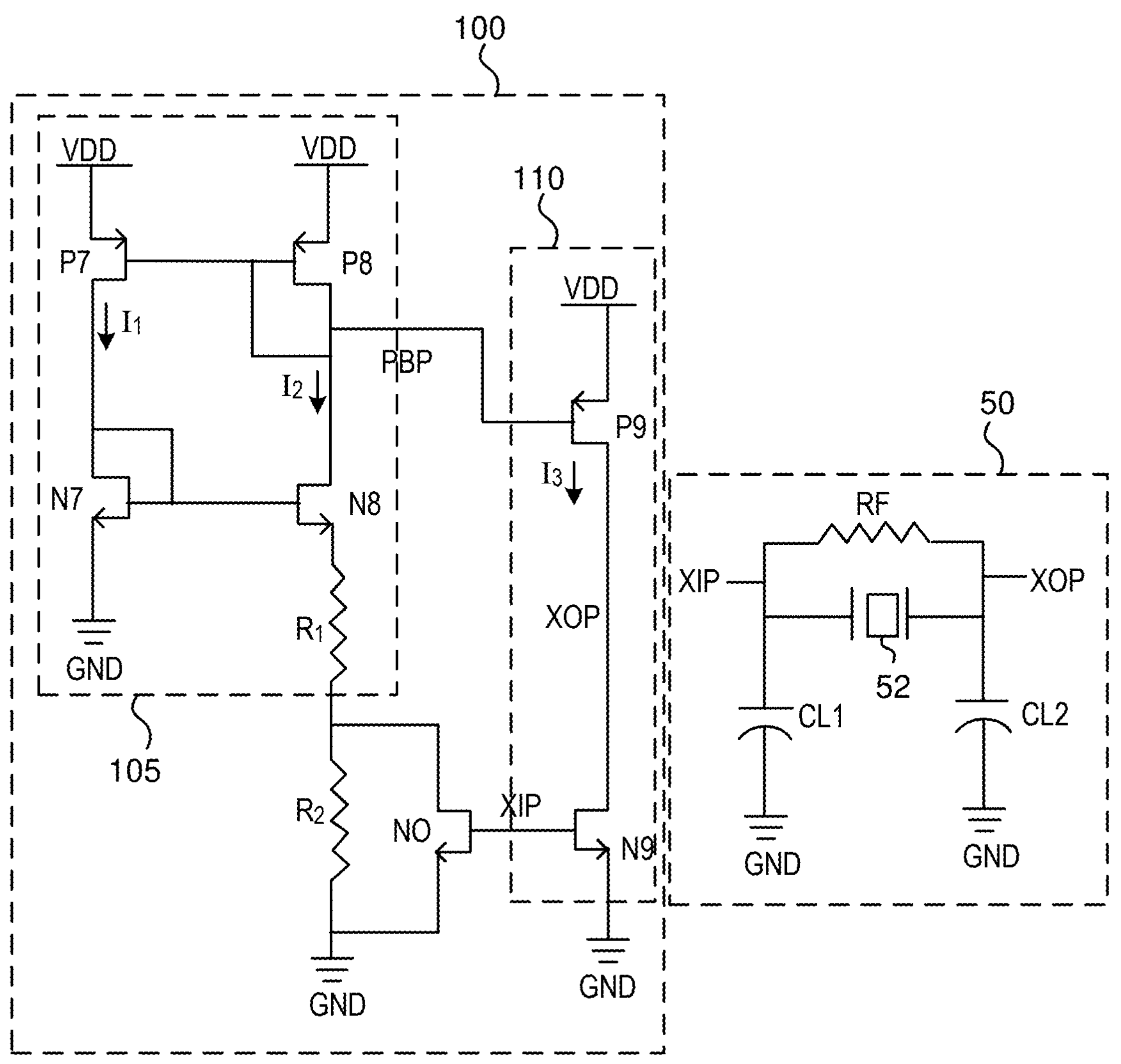
FIG. 1 is a schematic diagram of a crystal oscillator driver circuit, in accordance with one embodiment of the present disclosure.

FIG. 1 is a transistor-level schematic diagram of a crystal oscillator driver circuit (hereinafter alternatively referred to as driver circuit) 100, in accordance with one embodiment of the present disclosure, that is shown as driving a crystal oscillator circuit 50. Crystal oscillator circuit 50 is shown as including a crystal oscillator 52, capacitors CL1, CL2 and resistor $R_F$. Crystal oscillator 52 together with capacitors CL1, CL2 and resistor $R_F$ are often made using discrete components mounted on a printed circuit board. Crystal oscillator circuit 50 is therefore external to driver circuit 100.

Driver circuit 100 is shown as including, a transconductance amplifier 105, a common source amplifier 110, resistor $R_2$ coupled between transconductance amplifier 105 and the ground terminal, and transistor NO having source and drain terminal coupled across resistor $R_2$, and a gate terminal coupled to the input terminal XIP of common source amplifier 110.

Transconductance amplifier 105 (also referred to herein as constant $g_m$ amplifier) is shown as including PMOS transistors P7, P8, NMOS transistors N7, N8 and resistor $R_1$.

Transconductance refers to the ratio of the change in the drain current in response to a relatively small change in the gate voltage of a transistor. Transconductance amplifier 105 supplies a current through resistor $R_1$ that remains relatively stable over a range of statistical process variations (P), voltage (V) and temperature (T) variation, commonly referred to as PVT variations. It is understood that embodiments of the present disclosure are not limited to transconductance amplifier 105 shown in FIG. 1, and that any transconductance amplifier may be used in accordance with embodiments of the present disclosure.

Common source amplifier 110 is shown as including PMOS transistor P9 and NMOS transistor N9. Common source amplifier 110 causes the voltage signals at its input terminal XIP and its output terminal XOP to be inverse of one another (i.e., 180° out of phase). It is understood that embodiments of the present disclosure are not limited to common source amplifier 110 as shown in FIG. 1, and that any common source amplifier may be used in accordance with embodiments of the present disclosure. Driver circuit 100 operates as described below.

PMOS transistors P7 and P8 have the same gate-to-source voltage. Therefore, current $I_1$ flowing through transistors P7 and N7 is mirrored as current $I_2$ in transistors P8, N8 and resistor $R_1$. In other words, current $I_2$ is substantially the same as current $I_1$. In a similar manner, because PMOS transistors P8 and P9 have the same gate-to-source voltage, current $I_2$ is mirrored as current $I_3$ in transistors P9 and N9. The ratio of current $I_3$ to current $I_2$ depends on the ratio of the channel-width to channel length (W/L) of transistor P9 to the W/L of transistor P8. Current $I_3$ is selected to have a value that causes amplifier 110 to provide the desired negative resistance in accordance with the ESR of the crystal oscillator.

At the DC biasing point, node PBP, which is connected to the gate terminals of transistors P8 and P9, has a voltage that is one transistor threshold voltage (VT) smaller than the supply voltage VDD. For example, if the supply voltage VDD is at 1.8 volts and the transistors have a VT of 0.4 volts, node PBP is at 1.4 volts. This causes the voltage at the drain terminals of transistors P9 and N9, which are connected to output terminal XOP of the crystal oscillator circuit 50, to be, for example, between 0.42 to 0.46 volts. At the DC biasing point, capacitors CL1 and CL2 are open, therefore the input terminal XIO of crystal oscillator circuit 50 is shorted to output terminal XOP of the crystal oscillator circuit 50 through resistor $R_F$. Accordingly, at the DC biasing point, terminals (alternatively referred to herein as nodes) XIP has and XOP have the same voltage of 0.42 to 0.46 volts for the example described above.

Resistor $R_2$ has a resistance ranging from, for example, 1-5 KΩ. The ratio of the channel-width to channel-length (W/L) of transistor NO is selected such that at the DC biasing point when transistor N0 is on, the drain-to-source resistance of transistor N0 ranges from, for example, 1-5Ω. Accordingly, at the DC biasing point, because the voltage at node XIP is higher than the VT of transistor N0 thus causing transistor N0 to be on (i.e., conductive), a substantial portion of current $I_2$ flows through transistor N0 to the ground. When the voltage at node XIP is at a relatively high voltage, transistor N9 is also on thus causing node XOP to be pulled to the ground voltage through transistor N9.

As the oscillation through crystal oscillator 52 begins and the voltage at node XIP starts to decrease, the portion of current $I_2$ flowing to the ground through resistor $R_2$ increases and the portion of current $I_2$ flowing to the ground through transistor N0 decreases. When the voltage at XIP decreases to a level below the VT of transistor N0, transistor N0 turns off and all of the current $I_2$ flows to the ground through resistor $R_2$. Accordingly, because the resistance seen at the source terminal of transistor N8—defined by the sum of the resistances of resistors $R_1$ and $R_2$ when transistor N0 is off—increases, current $I_2$ decreases. The decrease in current $I_2$, in turn, causes the mirrored current $I_3$ to also decrease. Because the gate terminals of transistors N0 and N9 are connected to one another, transistor N9 is also turned off thus causing the reduced current $I_3$ to flow through crystal circuit 500. Accordingly, by increasing the resistance see at the source of transistor N8 and thus decreasing current $I_2$, current $I_3$ flowing through the crystal is also decreased so as not to degrade crystal 52. The decrease in current $I_3$ when XIP is at a low level, also causes the voltage at node XOP to remain substantially below the supply voltage VDD so as not to degrade crystal oscillator 52. The increase in the voltage at node XOP, in turn, causes the voltage at node XIP to increase through the crystal oscillator 52, thereby causing node XOP to be pulled to a low voltage through common-source amplifier 110 to maintain the oscillation. In one example, when VDD is at 1.8 volts, and the VT of transistors is 0.4 volts, the resistance of resistor $R_2$ is approximately 3 times the resistance of resistance of $R_1$.

Figure 2:
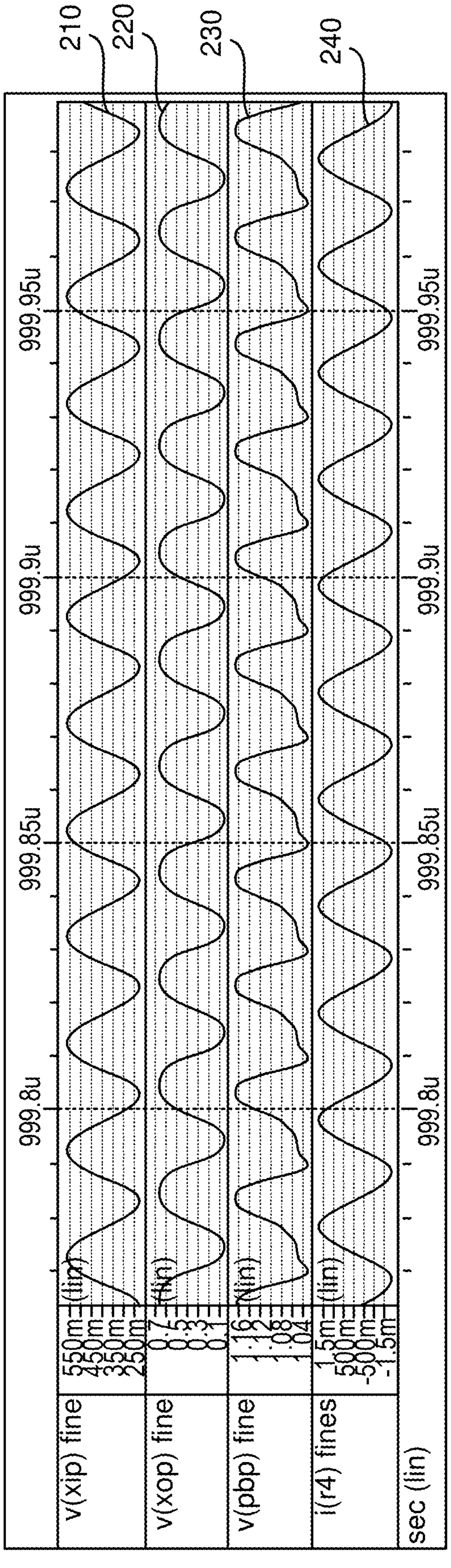
FIG. 2 shows a number of waveforms of the signals associated with the crystal oscillator driver circuit of FIG. 1.

Plots 210, 220, and 230 of FIG. 2 are computer simulation results of waveforms of the signals at nodes XIP, XOP, PBP of the driver circuit 100, in accordance with one example in which VDD is 1.8 volts. As seen from FIG. 2, the maximum swing of the voltage at node XIP is shown as being 353 mV, and the maximum swing of the voltage at node XOP is shown as being 607 mV in this example. Plot 230 shows that the voltage at node PBP varies from 1.04 to 1.16 volts. Plot 240 shows that the maximum root-mean squared (RMS) current through the crystal oscillator has a value of 1.32 mA. Based on the plots shown in FIG. 2, the voltage swing at the output of the crystal oscillator and the RMS current through the crystal are advantageously reduced by 50% when compared to those of conventional crystal oscillator driver circuits. As is also seen from FIG. 2, the driver circuit advantageously maintains the required 180° phase difference between the voltages at nodes XIP, XOP.

Figure 3:
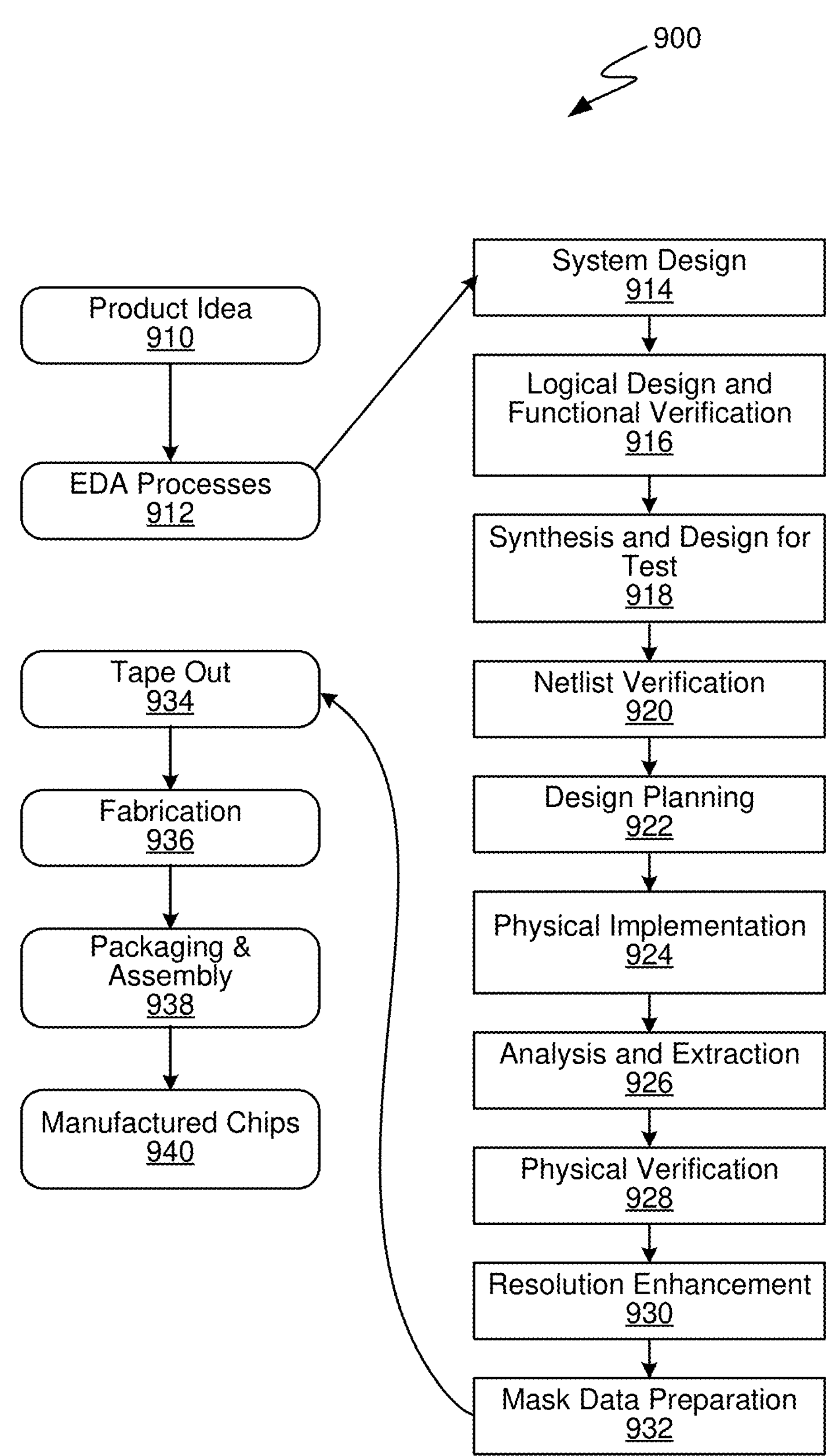
FIG. 3 depicts a flowchart of various processes used during the design and manufacture of an integrated circuit in accordance with some embodiments of the present disclosure.

FIG. 3 illustrates an example set of processes 900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information which is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 936 are performed to produce the finished integrated circuit 940.

Specifications for a circuit or electronic structure may range from low-level transistor material layouts to high-level description languages. A high-level description may be used to design circuits and systems, using a hardware description language ('HDL') such as VHDL, Verilog, SystemVerilog, SystemC, MyHDL or Open Vera. The HDL description can be transformed to a logic-level register transfer level ('RTL') description, a gate-level description, a layout-level description, or a mask-level description. Each lower level description adds more useful detail into the design description, for example, more details for the modules that include the description. The lower levels of description can be generated by a computer, derived from a design library, or created by another design automation process. An example of a specification language at a lower level language for specifying more detailed descriptions is SPICE, which is used for detailed descriptions of circuits with many analog components. Descriptions at each level is enabled for use by the corresponding tools of that layer (e.g., a formal verification tool). A design process may use a sequence depicted in FIG. 3. The processes described by be enabled by EDA products (or tools).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 1100 of FIG. 8) may be used to store the programs and data structures that are used by some or all of the EDA products described herein, and products used for development of cells for the library and for physical and logical design that use the library.

Figure 4:
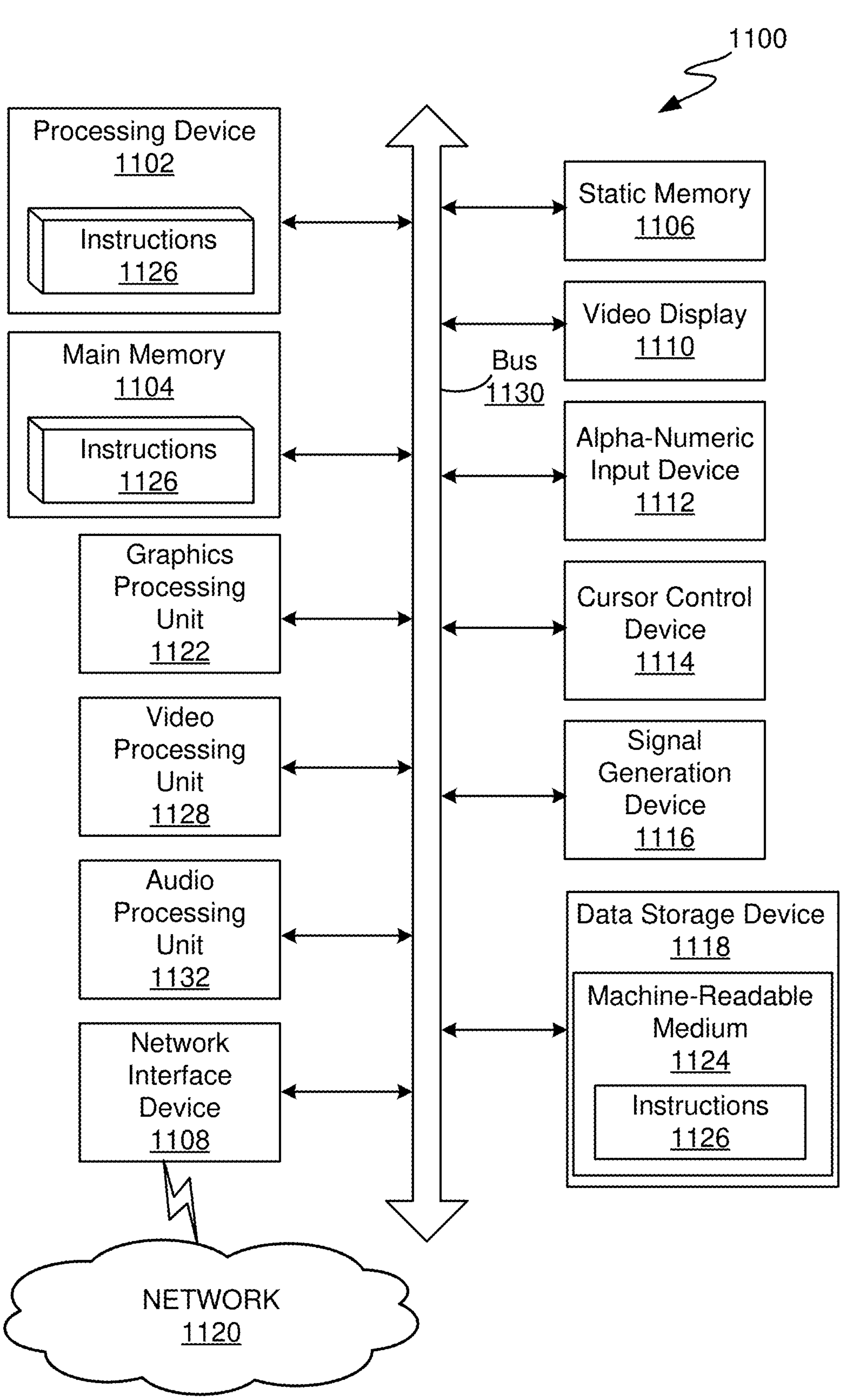
FIG. 4 depicts an example diagram of an example computer system in which embodiments of the present disclosure may operate.

FIG. 4 illustrates an example machine of a computer system 1100 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

Processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

What is claimed:

1. A circuit comprising:

a transconductance amplifier;

a common source amplifier coupled to an output of the transconductance amplifier and generating a signal coupled to an output terminal of a crystal oscillator circuit;

a first resistor coupled between the transconductance amplifier and a ground terminal; and a first NMOS transistor having a drain terminal coupled to a first terminal of the first resistor, a source terminal coupled to a second terminal of the first resistor, and a gate terminal coupled to an input terminal of the common source amplifier and to an input terminal of the crystal oscillator circuit.

2. The circuit of claim 1 wherein the transconductance amplifier comprises:

a first PMOS transistor having a source terminal coupled to a supply voltage;

a second NMOS transistor having gate and drain terminals coupled to a drain terminal of the first PMOS transistor, and a source terminal coupled to the ground terminal;

a second PMOS transistor having a source terminal coupled to the supply voltage, and gate and drain terminals coupled to a gate terminal of the first PMOS transistor;

a third NMOS transistor having a gate terminal coupled to the gate terminal of the second NMOS transistor, and a drain terminal coupled to the drain terminal of the second PMOS transistor; and a second resistor having a first terminal coupled to a source terminal of the third NMOS transistor and a second terminal coupled to the first terminal of the first resistor.

3. The circuit claim 1 wherein the common source amplifier comprises:

a third PMOS transistor having a gate terminal coupled to the gate terminal of the second PMOS transistor, and a source terminal coupled to the supply voltage;

a fourth NMOS transistor having a gate terminal coupled to the gate terminal of the first NMOS transistor, a drain terminal coupled to a drain terminal of the third PMOS transistor, and a source terminal coupled to the ground terminal.

4. The circuit of claim 3 wherein a ratio of a channel-width to channel-length of the first NMOS transistor is selected such that at a DC biasing point, a current flowing through the second resistor flows to the ground terminal substantially through the first NMOS transistor.

5. The circuit of claim 4 wherein at the DC biasing point, the gate and drain terminals of the fourth NMOS transistor are substantially at a same voltage.

6. The circuit of claim 5 wherein a resistance of the first resistor is at least three times a resistance of the second resistor.

7. The circuit of claim 6 wherein by varying the gate voltage of the first NMSO transistor, the current through the third PMOS transistor is varied.

8. A method comprising:

forming a transconductance amplifier;

coupling an output of the transconductance amplifier to a common source amplifier, the common source amplifier generating a signal coupled to an output terminal of a crystal oscillator circuit;

coupling a first resistor between the transconductance amplifier and a ground terminal; and forming a first NMOS transistor having a drain terminal coupled to a first terminal of the first resistor, a source terminal coupled to a second terminal of the first resistor, and a gate terminal coupled to an input terminal of the common source amplifier and to an input terminal of the crystal oscillator circuit.

9. The method of claim 8 wherein the transconductance amplifier comprises:

a first PMOS transistor having a source terminal coupled to a supply voltage;

a second NMOS transistor having gate and drain terminals coupled to a drain terminal of the first PMOS transistor, and a source terminal coupled to the ground terminal;

a second PMOS transistor having a source terminal coupled to the supply voltage, and gate and drain terminals coupled to a gate terminal of the first PMOS transistor;

a third NMOS transistor having a gate terminal coupled to the gate terminal of the second NMOS transistor, and a drain terminal coupled to the drain terminal of the second PMOS transistor; and a second resistor having a first terminal coupled to a source terminal of the third NMOS transistor and a second terminal coupled to the first terminal of the first resistor.

10. The method of claim 9 wherein the common source amplifier comprises:

a third PMOS transistor having a gate terminal coupled to the gate terminal of the second PMOS transistor, and a source terminal coupled to the supply voltage;

a fourth NMOS transistor having a gate terminal coupled to the gate terminal of the first NMOS transistor, a drain terminal coupled to a drain terminal of the third PMOS transistor, and a source terminal coupled to the ground terminal.

11. The method of claim 10 wherein a ratio of a channel-width to channel-length of the first NMOS transistor is selected such that at a DC biasing point, a current flowing through the second resistor flows to the ground terminal substantially through the first NMOS transistor.

12. The method of claim 11 wherein at the DC biasing point, the gate and drain terminals of the fourth NMOS transistor are substantially at a same voltage.

13. The method of claim 12 wherein a resistance of the first resistor is at least three times a resistance of the second resistor.

14. The method of claim 12 further comprising:

varying the current through the third PMOS transistor by varying the gate voltage of the first NMSO transistor.

15. A non-transitory computer readable medium comprising stored instructions, which when executed by a processor, cause the processor to generate a circuit design comprising:

a transconductance amplifier;

a common source amplifier coupled to an output of the transconductance amplifier and generating a signal coupled to an output terminal of a crystal oscillator circuit;

a first resistor coupled between the transconductance amplifier and a ground terminal; and a first NMOS transistor having a drain terminal coupled to a first terminal of the first resistor, a source terminal coupled to a second terminal of the first resistor, and a gate terminal coupled to an input terminal of the common source amplifier and to an input terminal of the crystal oscillator circuit.

16. The non-transitory computer readable medium of claim 15 wherein the transconductance amplifier comprises:

a first PMOS transistor having a source terminal coupled to a supply voltage;

a second NMOS transistor having gate and drain terminals coupled to a drain terminal of the first PMOS transistor, and a source terminal coupled to the ground terminal;

a second PMOS transistor having a source terminal coupled to the supply voltage, and gate and drain terminals coupled to a gate terminal of the first PMOS transistor;

a third NMOS transistor having a gate terminal coupled to the gate terminal of the second NMOS transistor, and a drain terminal coupled to the drain terminal of the second PMOS transistor; and a second resistor having a first terminal coupled to a source terminal of the third NMOS transistor and a second terminal coupled to the first terminal of the first resistor.

17. The non-transitory computer readable medium of claim 16 wherein the common source amplifier comprises:

a third PMOS transistor having a gate terminal coupled to the gate terminal of the second PMOS transistor, and a source terminal coupled to the supply voltage;

a fourth NMOS transistor having a gate terminal coupled to the gate terminal of the first NMOS transistor, a drain terminal coupled to a drain terminal of the third PMOS transistor, and a source terminal coupled to the ground terminal.

18. The non-transitory computer readable medium of claim 17 wherein a ratio of a channel-width to channel-length of the first NMOS transistor is selected such that at a DC biasing point, a current flowing through the second resistor flows to the ground terminal substantially through the first NMOS transistor.

19. The non-transitory computer readable medium of claim 18 wherein at the DC biasing point, the gate and drain terminals of the fourth NMOS transistor are substantially at a same voltage.

20. The non-transitory computer readable medium of claim 19 wherein a resistance of the first resistor is at least three times a resistance of the second resistor.

* * * * *